United States Patent
Lin et al.

(10) Patent No.: US 8,399,940 B2
(45) Date of Patent: Mar. 19, 2013

(54) PACKAGE STRUCTURE HAVING MEMS ELEMENTS AND FABRICATION METHOD THEREOF

(75) Inventors: Chen-Han Lin, Taichung Hsien (TW); Hong-Da Chang, Taichung Hsien (TW); Hsin-Yi Liao, Taichung Hsien (TW); Shih-Kuang Chiu, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 4 days.

(21) Appl. No.: 13/242,720

(22) Filed: Sep. 23, 2011

(65) Prior Publication Data

US 2012/0292722 A1    Nov. 22, 2012

(30) Foreign Application Priority Data

May 16, 2011    (TW) .............................. 100117007 A

(51) Int. Cl.
*H01L 29/84*    (2006.01)
(52) U.S. Cl. ................ 257/419; 257/678; 257/E29.324; 438/51
(58) Field of Classification Search .................. 257/419, 257/E29.324, 678; 438/51
See application file for complete search history.

(56) References Cited

U.S. PATENT DOCUMENTS

| | | | | |
|---|---|---|---|---|
| 2003/0122227 A1* | 7/2003 | Silverbrook | .................. | 257/678 |
| 2004/0104460 A1* | 6/2004 | Stark | .............................. | 257/678 |
| 2004/0259325 A1* | 12/2004 | Gan | .............................. | 438/456 |
| 2007/0190691 A1* | 8/2007 | Humpston et al. | ............ | 438/113 |
| 2008/0111203 A1* | 5/2008 | Pan et al. | ...................... | 257/415 |

* cited by examiner

*Primary Examiner* — Steven J Fulk
(74) *Attorney, Agent, or Firm* — Edwards Wildman Palmer LLP; Peter F. Corless; Steven M. Jensen

(57) ABSTRACT

A package structure having MEMS elements includes: a wafer having MEMS elements, electrical contacts and second alignment keys; a plate disposed over the MEMS elements and packaged airtight; transparent bodies disposed over the second alignment keys via an adhesive; an encapsulant disposed on the wafer to encapsulate the plate, the electrical contacts and the transparent bodies; bonding wires embedded in the encapsulant and each having one end connecting a corresponding one of the electrical contacts and the other end exposed from a top surface of the encapsulant; and metal traces disposed on the encapsulant and electrically connected to the electrical contacts via the bonding wires. The present invention eliminates the need to form through holes in a silicon substrate as in the prior art so as to reduce fabrication costs. Further, the present invention accomplishes wiring processes by using a common alignment device to thereby reduce equipment costs.

24 Claims, 4 Drawing Sheets

US 8,399,940 B2

PACKAGE STRUCTURE HAVING MEMS ELEMENTS AND FABRICATION METHOD THEREOF

CROSS-REFERENCES TO RELATED APPLICATIONS

This application claims under 35 U.S.C. §119(a) the benefit of Taiwanese Application No. 100117007, filed May 16, 2011, the entire contents of which is incorporated herein by reference.

BACKGROUND OF THE INVENTION

1. Field of the Invention

The present invention relates to package structures, and, more particularly, to a package structure having MEMS (micro-electro-mechanical system) elements and a fabrication method thereof.

2. Description of Related Art

MEMS elements have integrated electrical and mechanical functions and can be fabricated via various micro-fabrication technologies. A MEMS element can be disposed on a substrate and covered by a shield or packaged with an underfill adhesive so as to form a MEMS package structure.

FIG. 1 shows a cross-sectional view of a conventional package structure having a MEMS element. Referring to FIG. 1A, a MEMS element 11, such as a pressure sensing element, is disposed on an LGA (land grid array) substrate 10 and conductive pads 111 of the MEMS element 11 are electrically connected to conductive pads 101 of the LGA substrate 10 via a plurality of bonding wires. Further, a metal lid 12 is disposed on the substrate 10 for covering the MEMS element 11 so as to protect the MEMS element 11 against external damage and pollution. However, such a package structure has a large size and cannot meet the demand for lighter, thinner and smaller electronic products.

Accordingly, FIG. 2 shows a wafer-level package structure as disclosed by US Patent Application No. 2006/0185429. Referring to FIG. 2, MEMS elements 11 such as pressure sensing elements are directly formed on a silicon substrate 13, and glass lids 14 are bonded to the MEMS elements 11 via anodic bonding.

Further, the silicon substrate 13 has sensing cavities 131 and through holes 132 formed therein by using TSV (through silicon via) technology. Such a TSV technology uses KOH as an etchant for forming the through holes or recesses.

Compared with the previously described package structure, the present package structure has a greatly reduced size. However, the TSV technology for forming the through holes and recesses is costly and requires a high degree of accuracy, thus complicating the fabrication process and increasing the fabrication cost.

Therefore, it is imperative to provide a package structure having MEMS elements so as to overcome the above-described drawbacks.

SUMMARY OF THE INVENTION

Accordingly, the present invention provides a package structure having MEMS elements, which comprises: a wafer having a third surface and a fourth surface opposite to the third surface, wherein the third surface has a plurality of MEMS elements, a plurality of electrical contacts and a plurality of second alignment keys; a plate having a first surface with a plurality of recesses and a plurality of seal rings disposed around peripheries of the recesses, a second surface opposite to the first surface having a metal layer disposed thereon and a plurality of openings penetrating the first surface and second surfaces, wherein the seal rings of the plate are disposed on the third surface of the wafer such that the MEMS elements of the wafer are disposed in the recesses and enclosed by the seal rings and the electrical contacts and the second alignments keys are exposed via the openings of the plate; a plurality of transparent bodies disposed over the second alignment keys via an adhesive; an encapsulant disposed on the third surface of the wafer for encapsulating the plate, the electrical contacts and the transparent bodies; a plurality of bonding wires embedded in the encapsulant and each having one end connecting a corresponding one of the electrical contacts and the other end exposed from a top surface of the encapsulant; and a plurality of metal traces disposed on the encapsulant and electrically connected to the electrical contacts via the bonding wires.

The present invention further provides a fabrication method of a package structure having MEMS elements, which comprises the steps of: preparing a plate having opposite first and second surfaces and preparing a wafer having opposite third and fourth surfaces, wherein the first surface of the plate has a plurality of first alignment keys, a plurality of recesses and a plurality seal rings disposed around peripheries of the recesses, and the third surface of the wafer has a plurality of MEMS elements, a plurality of electrical contacts and a plurality of second alignment keys; bonding the plate and the wafer together by aligning the first alignment keys of the plate with the second alignment keys of the wafer and disposing the seal rings on the third surface of the wafer such that the MEMS elements of the wafer are disposed in the recesses and enclosed by the seal rings of the plate; partially removing the plate from the second surface thereof; forming a metal layer on the second surface of the plate; cutting the plate to form therein a plurality of openings exposing the electrical contacts and the second alignment keys; disposing a plurality of transparent bodies over the second alignment keys via an adhesive; connecting the electrical contacts and the metal layer via a plurality of bonding wires; forming an encapsulant on the third surface of the wafer so as to encapsulate the plate, the electrical contacts, the transparent bodies and the bonding wires; partially removing the encapsulant and the bonding wires from a top surface of the encapsulant so as to expose one end of each of the bonding wires, wherein the top surface of the encapsulant is higher than top surfaces of the transparent bodies; removing the encapsulant on the top surfaces of the transparent bodies; and aligning via the second alignment keys so as to form on the encapsulant a plurality of metal traces electrically connected to the electrical contacts via a plurality of bonding wires.

The present invention eliminates the need to form through holes in a silicon substrate as in the prior art so as to reduce equipment and fabrication costs. Further, the plate does not cover the bonding wires but the MEMS elements, and portions of the bonding wires are removed so as to reduce the overall thickness and size of the package structure. Furthermore, instead of forming additional alignment keys on the bottom surface of the wafer, the present invention allows the second alignment keys to be viewed via the transparent bodies such that a common alignment device can be used for an alignment step required in forming metal traces or an RDL layer, thereby reducing at least one round of exposure, development and etch processes and avoiding the use of an expensive double-sided alignment device so as to reduce fabrication costs and time.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

It should be noted that the drawings are only for illustrative purposes and not intended to limit the present invention. Meanwhile, terms such as 'up', 'down', 'a' and so on are used as a matter of descriptive convenience and not intended to have any other significance or provide limitations for the present invention.

FIGS. 3A to 3K show a fabrication method of a package structure having MEMS elements according to the present invention. Therein, FIG. 3E' is a top view of FIG. 3E, and FIG. 3J' is another embodiment of FIG. 3J.

Figure 1:
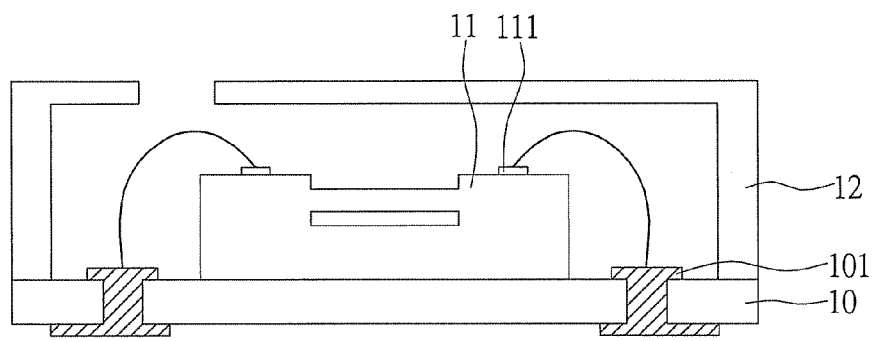
FIG. 1 is a cross-sectional view showing a conventional package structure having a MEMS element.
Figure 2:
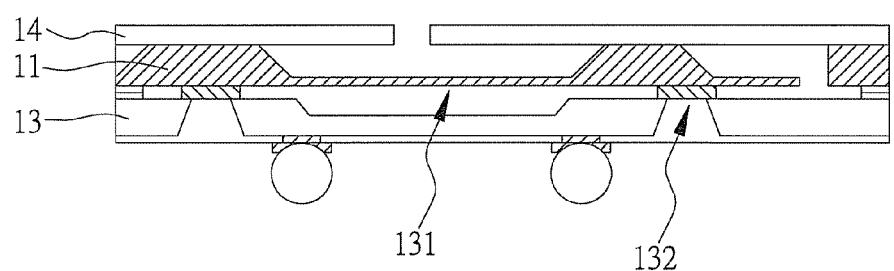
FIG. 2 is a cross-sectional view showing another conventional package structure having MEMS elements.
Figure 3A:
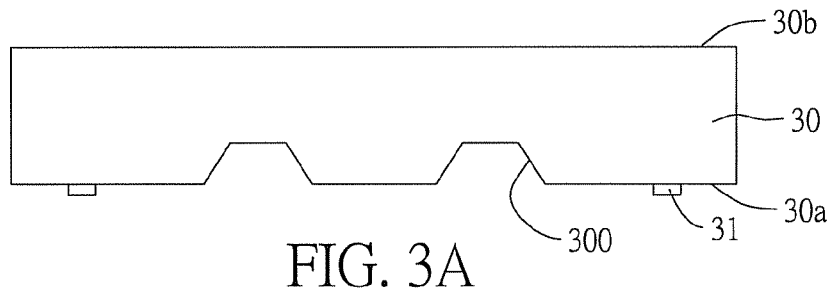
FIGS. 3A to 3K are cross-sectional views showing a package structure having MEMS elements and a fabrication method thereof according to the present invention, and FIG. 3E' is a top view of FIG. 3E, and FIG. 3J' shows another embodiment of FIG. 3J.

Referring to FIG. 3A, a plate 30 having a first surface 30a with a plurality of first alignment keys 31 and a second surface 30b opposite to the first surface 30a is provided. The plate 30 can be a silicon-containing substrate. Further, a plurality of recesses 300 are formed in the plate 30 via a process such as DRIE, KOH or TMAH etching.

Figure 3B:
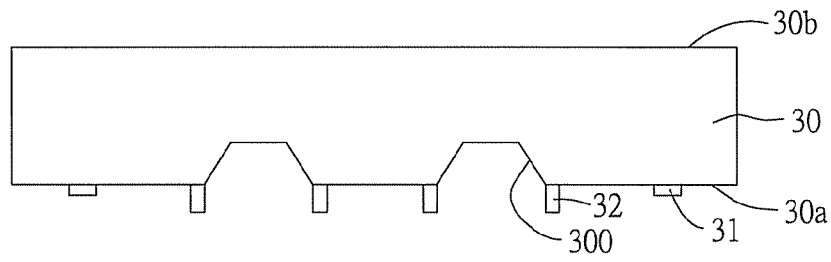

Referring to FIG. 3B, a plurality of seal rings 32 are disposed around peripheries of the recesses 300, respectively. The seal rings 32 can be made of, for example, glass frit, epoxy, dry film, Au, Cu, AuIn, solder, Ge, AlGe or SiGe.

Figure 3C:
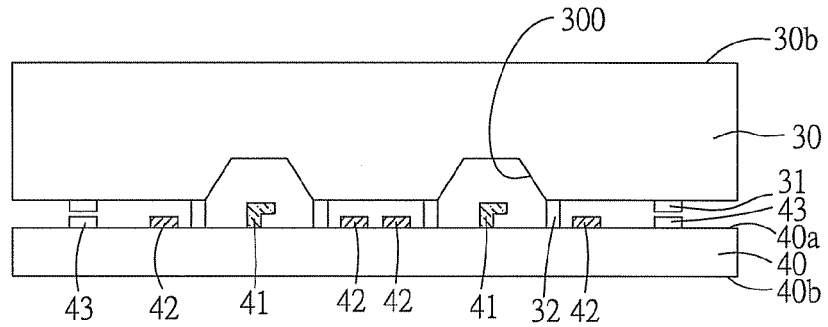

Referring to FIG. 3C, a wafer 40 having a third surface 40a and a fourth surface 40b opposite to the third surface 40a is provided. The third surface 40a has a plurality of MEMS element 41, a plurality of electrical contacts 42 and a plurality of second alignment keys 43. To bond the plate 30 and the wafer 40 together, the first alignment keys 31 of the plate 30 are aligned with the second alignment keys 43 of the wafer 40, respectively, and the seal rings 32 of the plate 30 are disposed on the third surface 40a of the wafer 40 such that the MEMS elements 41 are correspondingly disposed in the recesses 300 and enclosed by the seal rings 32. The MEMS elements 41 can be gyroscopes, accelerometers or RF MEMS elements.

Figure 3D:
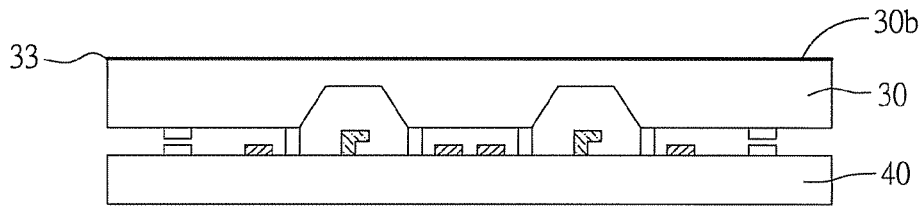

Referring to FIG. 3D, the plate 30 is partially removed by removing material from the second surface 30b so as to have a thickness of 200 to 300 μm. Further, a metal layer 33 is formed on the second surface 30b of the plate 30 by sputtering or evaporation. The metal layer 33 can be made of, for example, sequentially-deposited Al/Cu layers.

Figure 3E:
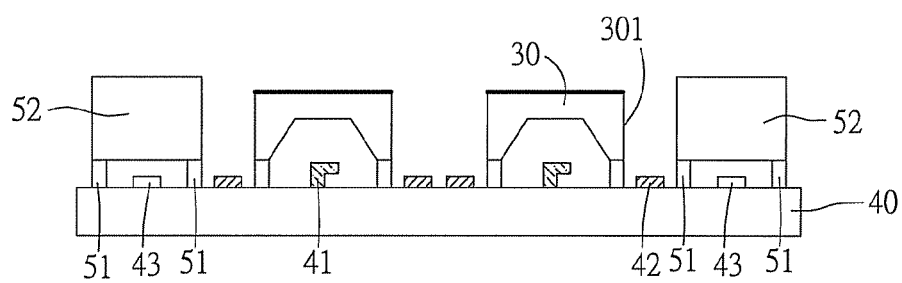
Figure 3E:
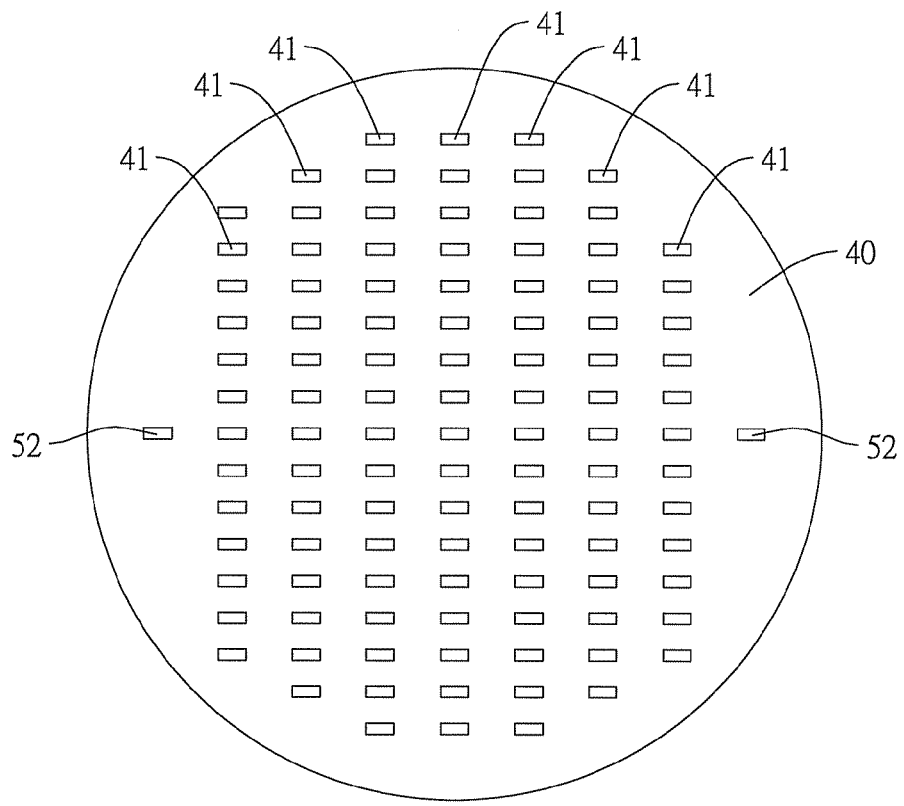

Referring to FIG. 3E, a cutting process is performed to the plate 30 so as to form openings 301 in the plate 30 for exposing the electrical contacts 42 and the second alignment keys 43. Then, by using a die bonder, a plurality of transparent bodies 52 is disposed over the second alignment keys 43 via an adhesive 51. The adhesive 51 can be made of, for example, glass frit, epoxy or dry film, and the transparent bodies 52 can be made of glass.

Referring to FIG. 3E', preferably, two transparent bodies 52 are disposed at the periphery of the wafer 40 and opposite to each other. It should be noted that FIG. 3E' is provided only for the purpose of illustrating the positions of the transparent bodies 52 (as well as the corresponding second alignment keys 43) and does not show all the components of FIG. 3E.

Figure 3F:
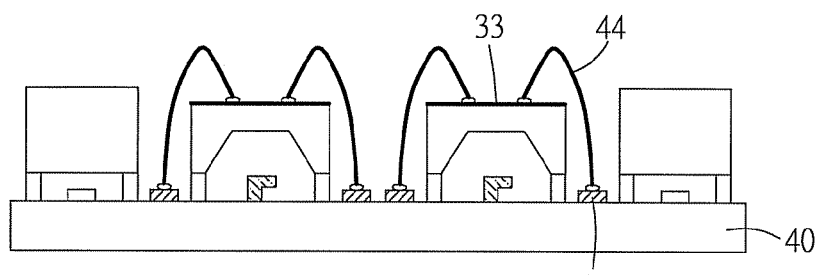

Referring to FIG. 3F, the electrical contacts 42 are connected to the metal layer 33 via a plurality of bonding wires 44.

Figure 3G:
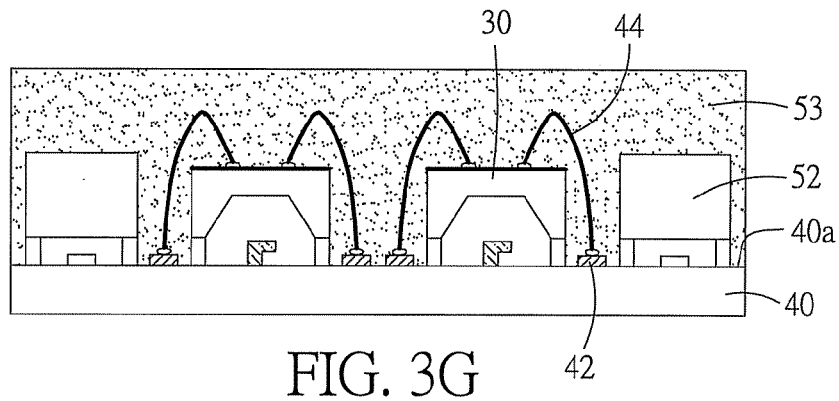

Referring to FIG. 3G, an encapsulant 53 is formed on the third surface 40a of the wafer 40 for encapsulating the plate 30, the electrical contacts 42, the transparent bodies 52 and the bonding wires 44.

Figure 3H:
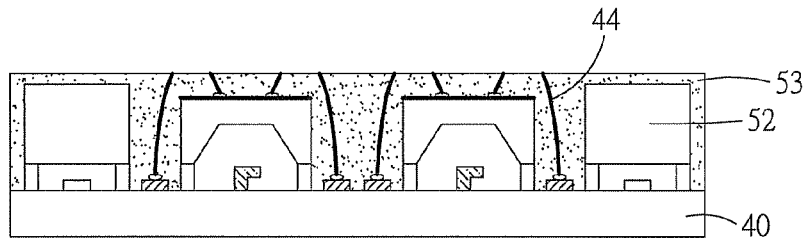

Referring to FIG. 3H, a grinding process is performed on the top surface of the encapsulant 53 to partially remove the encapsulant 53 and the bonding wires 44, thereby exposing one end of each of the bonding wires 44. Therein, the top surface of the encapsulant 53 is slightly higher than the top surfaces of the transparent bodies 52 so as to avoid grinding of the top surfaces of the transparent bodies 52 which otherwise could result in a blurred surface and adversely affect a subsequent alignment process.

Figure 3I:
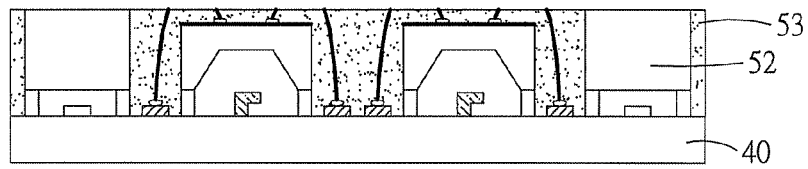

Referring to FIG. 3I, the encapsulant 53 on the top surfaces of the transparent bodies 52 is removed by laser ablation. As such, the top surfaces of the transparent bodies 52 are kept transparent.

Figure 3J:
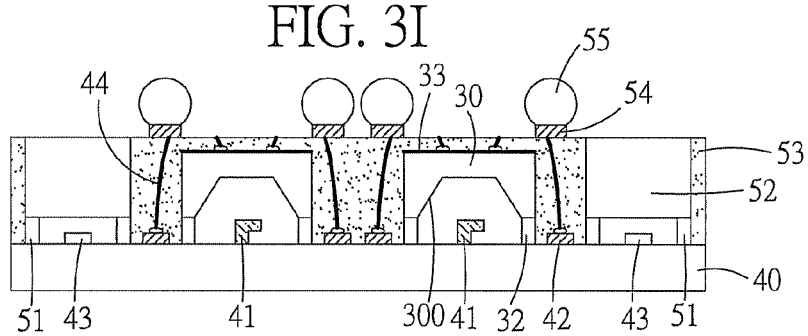
Figure 3J:
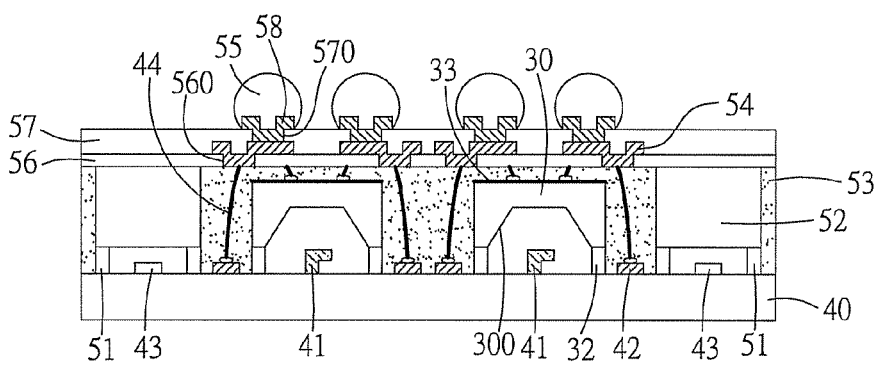

Referring to FIG. 3J, a plurality of metal traces 54 is formed on the encapsulant 53 via alignment of the second alignment keys 43, and the metal traces 54 are electrically connected to the electrical contacts 42 via a plurality of bonding wires 44. A plurality of solder balls 55 are further formed on the metal traces 54.

Alternatively, referring to FIG. 3J', a first insulating layer 56 is formed on the encapsulant 53 and has a plurality of openings 560 for exposing the bonding wires 44. The metal traces 54 are formed in the openings 560 for electrically connecting the bonding wires 44. Then, a second insulating layer 57 is formed on the first insulating layer 56 and the metal traces 54 and has a plurality of openings 570 for exposing portions of the metal traces 54. Further, an under bump metal layer 58 is formed in the openings 570 and solder balls 55 are formed on the under bump metal layer 58. That is, an RDL (Redistribution Line) process is performed to meet the requirement of fan out or fan in of the conductive pads.

Figure 3K:
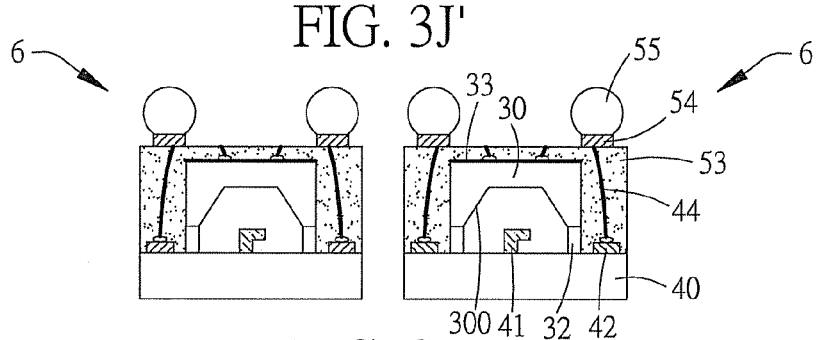

Referring to FIG. 3K, continued from FIG. 3J, a singulation process is performed to obtain a plurality of package structures 6 having MEMS elements.

The present invention further provides a package structure having MEMS elements, which has a wafer having a third surface 40a and a fourth surface 40b opposite to the third surface 40a, wherein the third surface has a plurality of MEMS elements 41, a plurality of electrical contacts 42 and a plurality of second alignment keys 43; a plate 30 having a first surface 30a with a plurality of recesses 300 and a plurality of seal rings 32 disposed around peripheries of the recesses 300, a second surface 30b opposite to the first surface 30a and having a metal layer 33 disposed thereon and a plurality of openings 301 penetrating the first surface 30a and the second surface 30b, wherein the seal rings 32 of the plate 30 are disposed on the third surface 40a of the wafer 40 such that the MEMS elements 41 of the wafer 40 are disposed in the recesses 300 and enclosed by the seal rings 32 and the electrical contacts 42 and the second alignments keys 43 are exposed via the openings 301 of the plate 30; a plurality of transparent bodies 52 disposed over the second alignment keys 43 via an adhesive 51; an encapsulant 53 disposed on the third surface 40a of the wafer 40 for encapsulating the plate 30, the electrical contacts 42 and the transparent bodies 52; a plurality of bonding wires 44 embedded in the encapsulant 53 with each having one end connecting to a corresponding one of the electrical contacts 42 and the other end exposed from the top surface of the encapsulant 53; and a plurality of metal traces 54 disposed on the encapsulant 53 and electrically connected to the electrical contacts 42 via the bonding wires 44.

The above-described package structure can further comprise a first insulating layer 56 disposed on the encapsulant 53 and having a plurality of openings 560 exposing the bonding wires 44 so as for the metal traces 54 to be disposed in the openings 560 and electrically connect the bonding wires 44. Further, the package structure can comprise a second insulating layer 57 disposed on the first insulating layer 56 and the metal traces 54 and having a plurality of openings 570 exposing portions of the metal traces 54.

The above-described package structure can further comprise a plurality of solder balls 55 disposed on the metal traces 54.

In the above-described package structure, the seal rings 32 can be made of glass frit, epoxy, dry film, Au, Cu, AuIn, solder, Ge, AlGe or SiGe.

In the above-described package structure, the metal layer 33 can be made of Al/Cu, and the transparent bodies 52 can be made of glass.

In the above-described package structure, the MEMS elements 41 can be gyroscopes, accelerometers or RF MEMS elements. The adhesive 51 can be made of glass frit, epoxy or dry film.

Therefore, the present invention eliminates the need to form through holes in a silicon substrate as in the prior art so as to reduce equipment and fabrication costs. Further, the plate does not cover the bonding wires but the MEMS elements, and portions of the bonding wires are removed so as to reduce the overall thickness and size of the package structure. Furthermore, instead of forming additional alignment keys on the bottom surface of the wafer, the present invention allows the second alignment keys to be viewed via the transparent bodies such that a common alignment device can be used for an alignment step required in forming metal traces or an RDL layer on the package, thereby reducing at least one round of exposure, development and etch processes and avoiding the use of an expensive double-sided alignment device so as to reduce the fabrication costs and time.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A package structure having MEMS (Micro-Electro-Mechanical System) elements, comprising:
    a wafer having a third surface and a fourth surface opposite to the third surface, wherein the third surface has a plurality of MEMS elements, a plurality of electrical contacts and a plurality of second alignment keys;
    a plate having a first surface with a plurality of recesses and a plurality of seal rings disposed around peripheries of the recesses, a second surface opposite to the first surface and having a metal layer disposed thereon and a plurality of openings penetrating the first surface and second surfaces, wherein the seal rings of the plate are disposed on the third surface of the wafer such that the MEMS elements of the wafer are disposed in the recesses and enclosed by the seal rings and the electrical contacts and the second alignments keys are exposed via the openings of the plate;
    a plurality of transparent bodies disposed over the second alignment keys via an adhesive;
    an encapsulant disposed on the third surface of the wafer for encapsulating the plate, the electrical contacts and the transparent bodies;
    a plurality of bonding wires embedded in the encapsulant and each having one end connecting a corresponding one of the electrical contacts and the other end exposed from a top surface of the encapsulant; and
    a plurality of metal traces disposed on the encapsulant and electrically connected to the electrical contacts via the bonding wires.

2. The structure of claim 1, further comprising a first insulating layer disposed on the encapsulant and having a plurality of openings exposing the bonding wires so as for the metal traces to be disposed in the openings of the first insulating layer and electrically connect the bonding wires.

3. The structure of claim 2, further comprising a second insulating layer disposed on the first insulating layer and the metal traces and having a plurality of openings for exposing portions of the metal traces.

4. The structure of claim 1, further comprising a plurality of solder balls disposed on the metal traces.

5. The structure of claim 2, further comprising a plurality of solder balls disposed on the metal traces.

6. The structure of claim 3, further comprising a plurality of solder balls disposed on the exposed portions of the metal traces.

7. The structure of claim 1, wherein the seal rings are made of glass frit, epoxy, dry film, Au, Cu, AuIn, solder, Ge, AlGe or SiGe.

8. The structure of claim 1, wherein the metal layer is made of Al/Cu.

9. The structure of claim 1, wherein the transparent bodies are made of glass.

10. The structure of claim 1, wherein the adhesive is made of glass frit, epoxy or dry film.

11. The structure of claim 1, wherein the MEMS elements are gyroscopes, accelerometers or RF MEMS elements.

12. A fabrication method of a package structure having MEMS elements, comprising the steps of:
    preparing a plate having opposite first and second surfaces and preparing a wafer having opposite third and fourth surfaces, wherein the first surface of the plate has a plurality of first alignment keys, a plurality of recesses and a plurality seal rings disposed around peripheries of the recesses, and the third surface of the wafer has a plurality of MEMS elements, a plurality of electrical contacts and a plurality of second alignment keys;
    bonding the plate and the wafer together by aligning the first alignment keys of the plate with the second alignment keys of the wafer and disposing the seal rings on the third surface of the wafer such that the MEMS elements of the wafer are disposed in the recesses and enclosed by the seal rings of the plate;
    partially removing the plate from the second surface thereof;
    forming a metal layer on the second surface of the plate;
    cutting the plate to form therein a plurality of openings exposing the electrical contacts and the second alignment keys;
    disposing a plurality of transparent bodies over the second alignment keys via an adhesive;
    connecting the electrical contacts and the metal layer via a plurality of bonding wires;
    forming an encapsulant on the third surface of the wafer so as to encapsulate the plate, the electrical contacts, the transparent bodies and the bonding wires;

partially removing the encapsulant and the bonding wires from the top surface of the encapsulant so as to expose one end of each of the bonding wires, wherein the top surface of the encapsulant is higher than top surfaces of the transparent bodies;

removing the encapsulant on the top surfaces of the transparent bodies; and aligning via the second alignment keys so as to form on the encapsulant a plurality of metal traces electrically connected to the electrical contacts via a plurality of bonding wires.

13. The method of claim 12, further comprising the step of, before forming the metal traces, forming a first insulating layer on the encapsulant and forming in the first insulating layer a plurality of openings exposing the bonding wires so as for the metal traces to be formed therein and electrically connect with the bonding wires.

14. The method of claim 13, further comprising the step of forming a second insulating layer on the first insulating layer and the metal traces and forming a plurality of openings in the second insulating layer for exposing portions of the metal traces.

15. The method of claim 12, further comprising the step of, after forming the metal traces, forming a plurality of solder balls on the metal traces.

16. The method of claim 13, further comprising the step of, after forming the metal traces, forming a plurality of solder balls on the metal traces.

17. The method of claim 14, further comprising the step of, after forming the metal traces, forming a plurality of solder balls on the exposed portions of the metal traces.

18. The method of claim 12, wherein the recesses are formed by DRIE, KOH or TMAH etching.

19. The method of claim 12, wherein the seal rings are made of glass frit, epoxy, dry film, Au, Cu, AuIn, solder, Ge, AlGe or SiGe.

20. The method of claim 12, wherein the metal layer is made of Al/Cu.

21. The method of claim 12, wherein the transparent bodies are made of glass.

22. The method of claim 12, wherein the adhesive is made of glass frit, epoxy or dry film.

23. The method of claim 12, wherein the MEMS elements are gyroscopes, accelerometers or RF MEMS elements.

24. The method of claim 12, further comprising the step of performing a singulation process so as to obtain a plurality of package structures having MEMS elements.

* * * * *